(12) United States Patent
Cheah et al.

(10) Patent No.: US 11,121,074 B2
(45) Date of Patent: Sep. 14, 2021

(54) PACKAGED DIE STACKS WITH STACKED CAPACITORS AND METHODS OF ASSEMBLING SAME

(71) Applicant: Intel Corporation, Santa Clara, CA (US)

(72) Inventors: Bok Eng Cheah, Bukit Gambir (MY); Mooi Ling Chang, Bayan Baru (MY); Ping Ping Ooi, Butterworth (MY); Jackson Chung Peng Kong, Tanjung Tokong (MY); Wen Wei Lum, Sungai Petani (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/819,963

(22) Filed: Mar. 16, 2020

(65) Prior Publication Data

US 2021/0005547 A1    Jan. 7, 2021

Related U.S. Application Data

(63) Continuation of application No. 16/017,652, filed on Jun. 25, 2018, now Pat. No. 10,593,618.

(30) Foreign Application Priority Data

Jun. 29, 2017  (MY) .......................... PI 2017702405

(51) Int. Cl.
*H01L 23/522*    (2006.01)
*H01L 49/02*    (2006.01)
(Continued)

(52) U.S. Cl.
CPC .......... *H01L 23/5223* (2013.01); *H01G 4/30* (2013.01); *H01G 4/38* (2013.01); *H01G 4/40* (2013.01); *H01L 24/17* (2013.01); *H01L 25/0657* (2013.01); *H01L 25/16* (2013.01); *H01L 28/60* (2013.01); *H01L 23/50* (2013.01); *H01L 23/5389* (2013.01); *H01L 24/16* (2013.01); *H01L 2224/16145* (2013.01); *H01L 2224/16146* (2013.01); *H01L 2224/16225* (2013.01); *H01L 2224/16265* (2013.01); *H01L 2224/171* (2013.01); *H01L 2224/17181* (2013.01); *H01L 2224/18* (2013.01);
(Continued)

(58) Field of Classification Search
None
See application file for complete search history.

(56) References Cited

U.S. PATENT DOCUMENTS 10,199,356 B2    2/2019  Kinsley
10,593,618 B2 *  3/2020  Cheah ...................... H01G 4/38
(Continued)

OTHER PUBLICATIONS

"U.S. Appl. No. 16/017,652, Non Final Office Action dated Apr. 18, 2019", 17 pgs.
(Continued)

*Primary Examiner* — Hsien Ming Lee
(74) *Attorney, Agent, or Firm* — Schwegman Lundberg & Woessner, P.A.

(57) ABSTRACT

A stacked-die and stacked-capacitor package vertically arranged capacitors to mirror a semiconductive-device
(Continued)

stack. The stacked capacitor can be electrically coupled to one or more semiconductive devices in the stacked architecture.

7 Claims, 9 Drawing Sheets

(51) Int. Cl.
    *H01L 25/16*     (2006.01)
    *H01L 23/00*     (2006.01)
    *H01G 4/30*     (2006.01)
    *H01L 25/065*     (2006.01)
    *H01G 4/40*     (2006.01)
    *H01G 4/38*     (2006.01)
    *H01L 23/538*     (2006.01)
    *H01L 23/50*     (2006.01)

(52) U.S. Cl.
    CPC ............... *H01L 2224/32265* (2013.01); *H01L 2224/73203* (2013.01); *H01L 2224/73259* (2013.01); *H01L 2924/15311* (2013.01); *H01L 2924/19105* (2013.01)

(56) References Cited

U.S. PATENT DOCUMENTS

| | | |
|---|---|---|
| 2016/0233195 A1 | 8/2016 | Nagai |
| 2018/0366456 A1 | 12/2018 | Jeong et al. |
| 2019/0006277 A1 | 1/2019 | Cheah et al. |

OTHER PUBLICATIONS

"U.S. Appl. No. 16/017,652, Response filed Jul. 18, 2019 to Non Final Office Action dated Apr. 18, 2019", 9 pgs.
"U.S. Appl. No. 16/017,652, Final Office Action dated Aug. 2, 2019", 6 pgs.
"U.S. Appl. No. 16/017,652, Examiner Interview Summary dated Oct. 17, 2019", 3 pgs.
"U.S. Appl. No. 16/017,652, Response filed Oct. 21, 2019 to Final Office Action dated Aug. 2, 2019", 7 pgs.
"U.S. Appl. No. 16/017,652, Notice of Allowance dated Nov. 1, 2019", 9 pgs.

\* cited by examiner

PACKAGED DIE STACKS WITH STACKED CAPACITORS AND METHODS OF ASSEMBLING SAME

PRIORITY APPLICATION

This application is a continuation of U.S. application Ser. No. 16/017,652, filed Jun. 25, 2018, which claims the benefit of priority to Malaysian Application Serial Number PI 2017702405, filed Jun. 29, 2017, all of which are incorporated herein by reference in their entirety.

FIELD

This disclosure relates to power delivery for a stacked-die apparatus that allows for capacitor integration into smaller form-factor packaging.

BACKGROUND

Semiconductive device miniaturization includes challenges for passive devices to be located at useful proximity to other structures.

BRIEF DESCRIPTION OF THE DRAWINGS

Disclosed embodiments are illustrated by way of example, and not by way of limitation, in the figures of the accompanying drawings where like reference numerals may refer to similar elements, in which.

DETAILED DESCRIPTION

Power-delivery efficiency in semiconductive packages is provided for 3D stacked-dice architectures by decreasing the decoupling loop-inductance path, such as the path from a decoupling capacitor to a semiconductive die the capacitor is servicing. Scaling issues are addressed by stacking a decoupling capacitor into a stacked-die level, which keeps the decoupling capacitor close to a semiconductive die also in the stacked level. Two or more semiconductive devices are arranged in a stacked architecture within a package, and at least one capacitor may be stacked with any given stacked semiconductive device. The architecture may be referred to as stacked-die, stacked-capacitor (SDSC) architecture.

In an embodiment, a capacitor stack is vertically arranged to mirror a semiconductive-device stack. In an embodiment, the stacked capacitor is electrically coupled to one or more semiconductive devices in the stacked architecture. In an embodiment, more than one stacked capacitor is electrically coupled to a given semiconductive device in the device stack. In an embodiment, a rail connects two or more capacitors on a given stack level in the device stack, to service the semiconductive device at that stack level. In an embodiment, vertical interconnects create a vertical power rail that allows for vertically stacked capacitors to service a given semiconductive device. In an embodiment, lateral interconnects between capacitors combine with vertical power ail stacked capacitors to service at least one semiconductive device.

Figure 1:
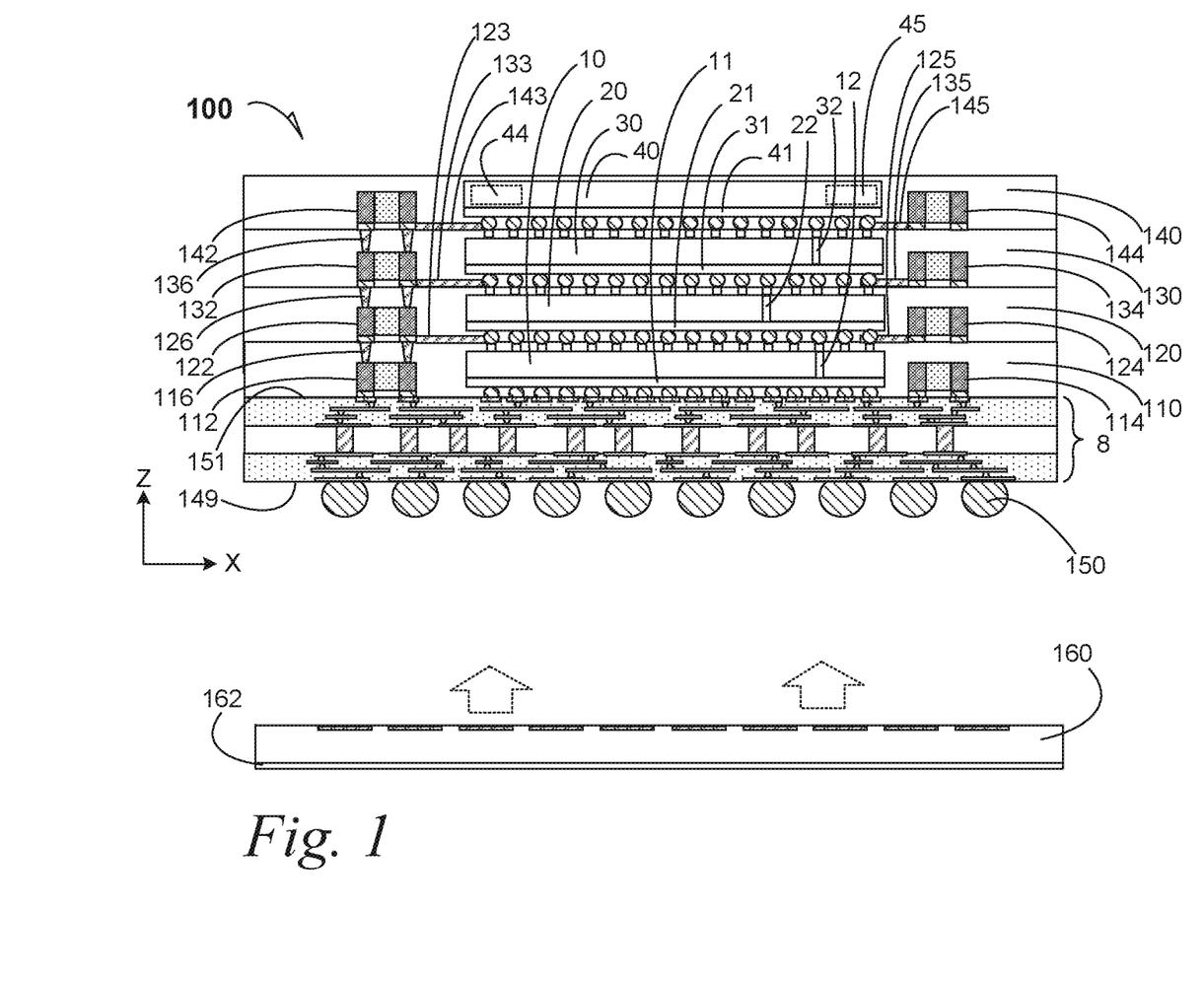
FIG. 1 is a cross-section elevation of a semiconductive apparatus according to an embodiment.

FIG. 1 is a cross-section elevation of a semiconductive apparatus 100 according to an embodiment. A primary die 10 is disposed on a package substrate 8. Incidental traces, vias, a core, and core vias are depicted within the package substrate 8. Not all of these conductive structures are illustrated in diagonal cross-section.

The primary die 10 includes an active surface 11 that includes both semiconductive devices and metallization according to an embodiment. The primary die 10 also includes a primary-level through-silicon via (TSV) 12 that communicates from the active surface 11 to the primary die backside. In an embodiment, the primary-level TSV 12 is one of several primary-level TSVs that principally provide electronic communication (as well as power and ground connections) to any semiconductive devices that are stacked above (positive-Z direction) the primary die 10. In an embodiment, the primary die 10 is located at a primary package level that is delineated by the presence of a primary molding layer 110. In an embodiment, the molding layer 110 or any molding layer set forth in this disclosure, is an encapsulation layer by virtue of the end result of formation. Other processes may be used to for a given encapsulation layer other than using a molding material and a mold chase etc.

In an embodiment, a first primary-level capacitor 112 is disposed on the package substrate 8 at the primary package level. The first primary-level capacitor 112 is electrically coupled to the primary die 10 through traces and vias that are located within the package substrate 8. In an embodiment, a subsequent primary-level capacitor 114 is also disposed on the package substrate 8 at the primary package level.

The package substrate 8 is electrically bumped on a land side with a plurality of electrical bumps, one of which is indicated with reference number 150. The first and subsequent primary-level capacitors 112 and 114, respectively, are seated on a die side 151 of the package substrate 8, and the plurality of electrical bumps 150 are seated on a land side 149 of the package substrate 8. The subsequent primary-level capacitor 114 is also electrically coupled to the primary die 10 by traces and vias located within the package substrate 8.

In an embodiment, a secondary die 20 is disposed at a secondary level that is delineated within a secondary molding layer 120. The secondary die 20 includes an active surface 21 that includes both semiconductive devices and metallization according to an embodiment. The secondary die 20 also includes a TSV 22 that communicates from the active surface 21 to the secondary die backside. In an embodiment, the secondary-level TSV 22 is one of several secondary-level TSVs that principally provide electronic communication to the primary die 10, (as well as power and ground connections) and to any semiconductive devices that are stacked above the secondary die 20.

In an embodiment, a first secondary-level capacitor 122 is disposed within the secondary package level. The first secondary-level capacitor 122 is electrically coupled to the secondary die 20 through a secondary-level merged power rail 123 according to an embodiment. Additionally the first secondary-level capacitor 122 is also part of a merged vertical power rail that includes a primary-level through-mold via (TMV) 116. The primary-level TMV 116 is within the primary level that is delineated by the primary molding layer 110. Additionally, the primary-level TMV 116 directly contacts the first primary-level capacitor 112 and the first secondary-level capacitor 122. Thus, the first primary-level capacitor 112 and the first secondary-level capacitor 122 are connected as part of a vertical (Z-direction) power rail.

In an embodiment, a subsequent secondary-level capacitor 124 is also disposed within the secondary level. The subsequent secondary-level capacitor 124 is also electrically coupled to the secondary die 20 by a dedicated secondary-level power rail 125. Communication between the primary die 10 and the secondary die 20 is also accomplished by a primary-level TSV 12.

Where the secondary die 20 is located within the last layer of a semiconductive package, the secondary die 20 and the secondary level delineated by the secondary molding layer 120 and other structures, are referred to as the subsequent die 20, subsequent molding layer 120, etc. Further, the location of the subsequent structures may be referred to as being stacked above (Z-direction) the primary level and primary-level structures.

In an embodiment, a tertiary die 30 is disposed at a tertiary level that is delineated within a tertiary molding layer 130. The tertiary die 30 includes an active surface 31 that includes both semiconductive devices and metallization according to an embodiment. The tertiary die 30 also includes a TSV 32 that communicates from the active surface 31 to the tertiary die backside. In an embodiment, the tertiary-level TSV 32 is one of several tertiary-level TSVs that principally provide electronic communication (as well as power and ground connections) to the secondary die 20 and to any semiconductive devices that are stacked above the tertiary die 30.

In an embodiment, a first tertiary-level capacitor 132 is disposed within the tertiary package level. The first tertiary-level capacitor 132 is electrically coupled to the tertiary die 30 through a tertiary-level merged power rail 133 according to an embodiment. Additionally the first tertiary-level capacitor 132 is also part of a merged vertical power rail that includes the primary-level TMV 116 and a secondary-level TMV 126. The secondary-level TMV 126 is within the secondary level that is delineated by the secondary molding layer 120. Additionally, the secondary-level TMV 126 directly contacts the first secondary-level capacitor 122 and the first tertiary-level capacitor 132. Thus, the first primary-level capacitor 112, the first secondary-level capacitor 122 and the first tertiary-level capacitor 132 are part of a vertical (Z-direction) power rail.

In an embodiment, a subsequent tertiary-level capacitor 134 is also disposed within the tertiary level. The subsequent tertiary-level capacitor 134 is also electrically coupled to the tertiary die 30 by a tertiary-level dedicated power rail 135. Communication between the secondary die 20 and the tertiary die 30 is also accomplished by a secondary-level TSV 22 that may be accompanied similar to other level TSVs with similar signal and power/ground TSVs.

Where the tertiary die 30 is located within the last layer of a semiconductive package, the tertiary die 30 and the tertiary level delineated by the tertiary molding layer 130 and other structures, are referred to as the subsequent die 30, subsequent molding layer 130, etc.

In an embodiment, a quaternary die 40 is disposed at a quaternary level that is delineated within a quaternary molding layer 140. The quaternary die 40 includes an active surface 41 that includes both semiconductive devices and metallization according to an embodiment. Where the quaternary die 40 is the last die in a die stack, no TSV may be present within the quaternary die 40.

In an embodiment, a first quaternary-level capacitor 142 is disposed within the quaternary package level. The first quaternary-level capacitor 142 is electrically coupled to the quaternary die 40 through a quaternary-level merged power rail 143 according to an embodiment. Additionally the first quaternary-level capacitor 142 is also part of a merged vertical power rail that includes the primary-level TMV 116, the secondary-level TMV 126 and a tertiary-level TMV 136. The tertiary-level TMV 136 is within the tertiary level that is delineated by the tertiary molding layer 130. Additionally, the tertiary-level TMV 136 directly contacts the first tertiary-level capacitor 132 and the first quaternary-level capacitor 142. Thus, the first primary-level capacitor 112, the first secondary-level capacitor 122, the first tertiary-level capacitor 132 and the first quaternary-level capacitor 142 are part of a vertical (Z-direction) power rail.

In an embodiment, a subsequent quaternary-level capacitor 144 is also disposed within the quaternary level. The subsequent quaternary-level capacitor 144 is also electrically coupled to the quaternary die 40 by a quaternary-level dedicated power rail 145. Communication between the tertiary die 30 and the quaternary die 40 is also accomplished by a tertiary-level TSV 32 that may be accompanied similar to other level TSVs with similar signal and power/ground TSVs.

Where the quaternary die 40 is located within the last layer of a semiconductive package, the quaternary die 40 and the quaternary level delineated by the quaternary molding layer 140 and other structures, are referred to as the subsequent die 40, subsequent molding layer 140, etc.

Several power rail voltages may be used for the various capacitors. In an embodiment, the power rail voltage is operated in a range from 0.5V to 5V. A common rail is used to complete circuitry that experiences voltages from the power rail. In an embodiment, the common rail operates at a voltage of 0.9 V. In an embodiment, the common rail operates at a voltage of 1.0V. In an embodiment, the common rail operates at a voltage of 1.2V. In an embodiment, the common rail operates at a voltage of 1.5V. In an embodiment, the common rail operates at a voltage of 1.8V. In an embodiment, the common rail operates at a voltage of 3.3V.

As depicted in FIG. 1 and in an embodiment for all package substrates 8, the electrical bump array 150 is seated onto a board 160 such as a motherboard 160. In an embodiment, the board 160 includes a physical and electrically insulative shell 162 such as the outer shell of a computing system. Processing to seat the package substrate 8 onto the board 160 is illustrated by the directional arrows, depicted in dashed lines, that illustrate movement of the board 160 toward the package substrate 8.

Figure 2:
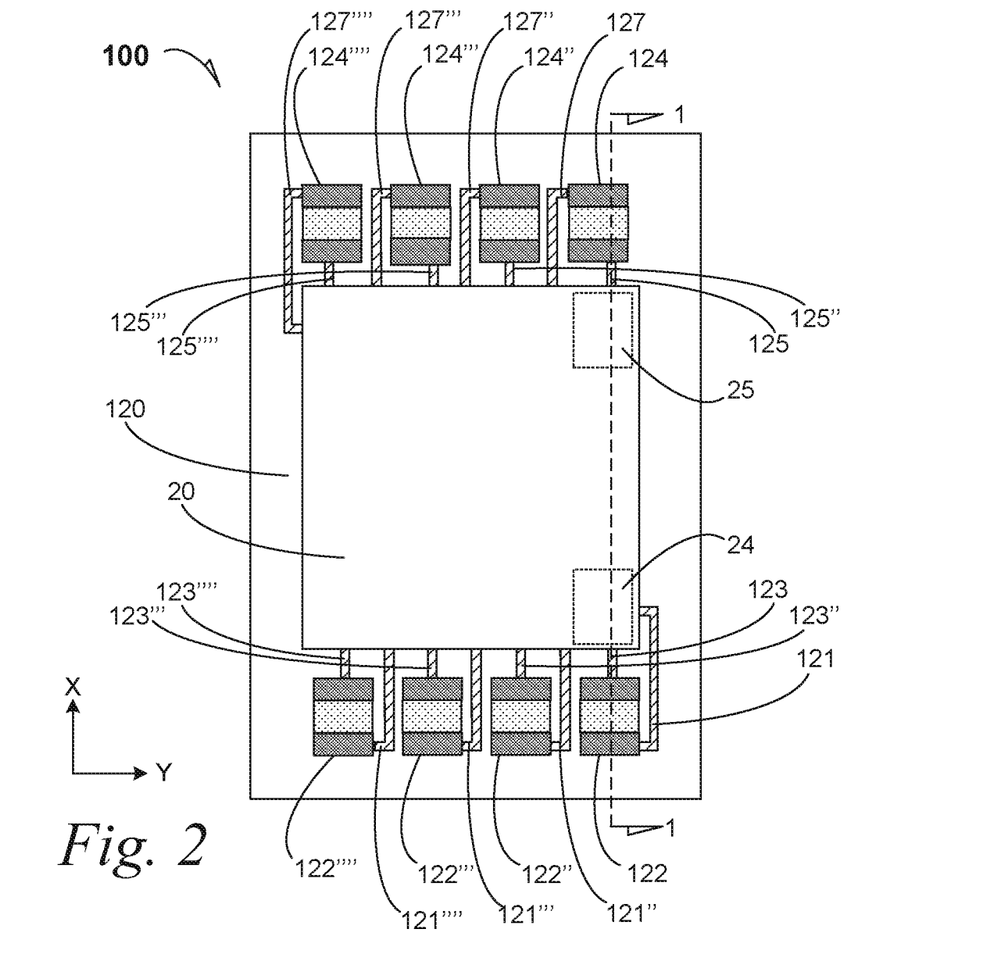
FIG. 2 is a top plan cut away view of the semiconductive apparatus depicted in FIG. 1 according to an embodiment.

FIG. 2 is a top plan cut away view of the semiconductive apparatus 100 depicted in FIG. 1 according to an embodiment. The top plan cut-away view is taken within the secondary level. The secondary die 20 is exposed within the secondary molding layer 120. The cross-section view depicted in FIG. 1 is taken from FIG. 2 along the section line 1-1.

The first secondary-level capacitor 122 is exposed along with the secondary-level merged power rail 123. The secondary-level merged power rail 123 touches the first secondary-level capacitor 122 at an electrode portion of the capacitor 122. Additionally, a conductive trace associated with an opposite polarity of the power rail (e.g., Vss or ground) 121 completes electrical flow through the first secondary-level capacitor 122, by connection to the electrode opposite that connected by the merged power rail 123.

The subsequent secondary-level capacitor 124 is exposed along with the dedicated secondary-level power rail 125. The secondary-level dedicated power rail 125 touches the subsequent secondary-level capacitor 124 at an electrode portion of the capacitor 124. Additionally, a conductive trace associated with an opposite polarity of the power rail (e.g., Vss or ground) 127 completes electrical flow through the subsequent secondary-level capacitor 124.

Reference is made to FIG. 1 with FIG. 2. In an embodiment, the quaternary die 40 uses the merged power rail configuration seen on the left side of FIG. 1, including the collective capacitors 112, 122, 132 and 142 to deliver a discharge into the quaternary die 40 at a first die feature 44 within the die 40 (depicted in FIG. 1 within a ghosted-line are 44) that requires the collective discharge of the several capacitors 112, 122, 132 and 142. In an embodiment, the quaternary die 40 requires a delivered capacitor discharge at a subsequent die feature 45 within the quaternary die 40 (depicted within a ghosted-line area 45) that only requires the single discharge of the subsequent secondary-level capacitor 144. The capacitor configurations are located as close as useful to the several die features according to discharge requirements in the die features.

As illustrated in FIG. 2, several capacitors are present beyond the first secondary-level capacitor 122 and the subsequent secondary-level capacitor 124. In an embodiment, the first secondary-level capacitor 122 is accompanied by three secondary-level capacitors 122", 122''' and 122"". Within the secondary die 20, a first die feature 24 is located at least in part where the first die feature 44 is analogously located within the quaternary die 40 as seen in FIG. 1. The first die feature 24 uses the capacitor 122 for discharge requirements according to an embodiment, and in an embodiment where more capacitor discharge is needed for the first die feature 24, the merged rail 116 allows for discharge of at least the first primary-level capacitor 112 and the first secondary-level capacitor 122 as seen in FIG. 1.

As illustrated in FIG. 2, several capacitors are present beyond the subsequent secondary-level capacitor 124. In an embodiment, the subsequent secondary-level capacitor 124 is accompanied by three subsequent secondary-level capacitors 124", 124''' and 124"". Within the secondary die 20, a subsequent die feature 25 is located at least in part where the subsequent die feature 45 is analogously located within the quaternary die 40 as seen in FIG. 1. The subsequent die feature 25 uses the dedicated capacitor 124 for discharge requirements according to an embodiment.

Figure 1A:
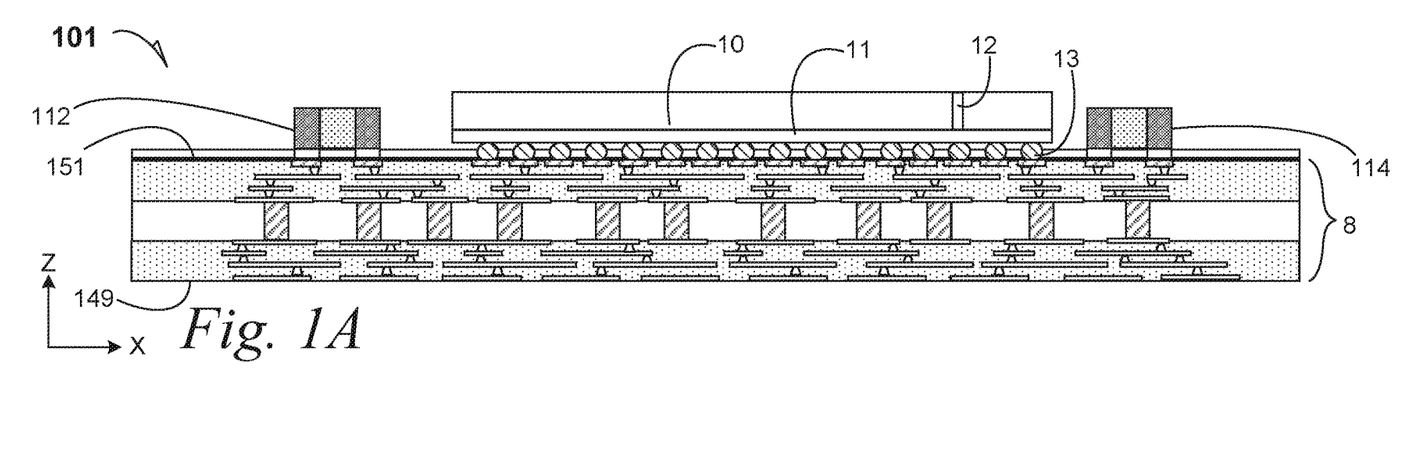
FIG. 1A is a cross-section elevation of the semiconductive apparatus depicted in FIG. 1 during assembly according to an embodiment.

FIG. 1A is a cross-section elevation 101 of the semiconductive apparatus 100 depicted in FIG. 1 during assembly according to an embodiment. The package substrate 8 has been contacted with the primary die 10 by flip-chip bumping the die 10 onto a ball array, one ball of which is indicated by reference number 13. The first primary-level capacitor 112 and the subsequent primary-level capacitor 114 are seated on the package substrate 8 and they are electrically connected to the primary die 10 through traces and vias within the package substrate 8.

Figure 1B:
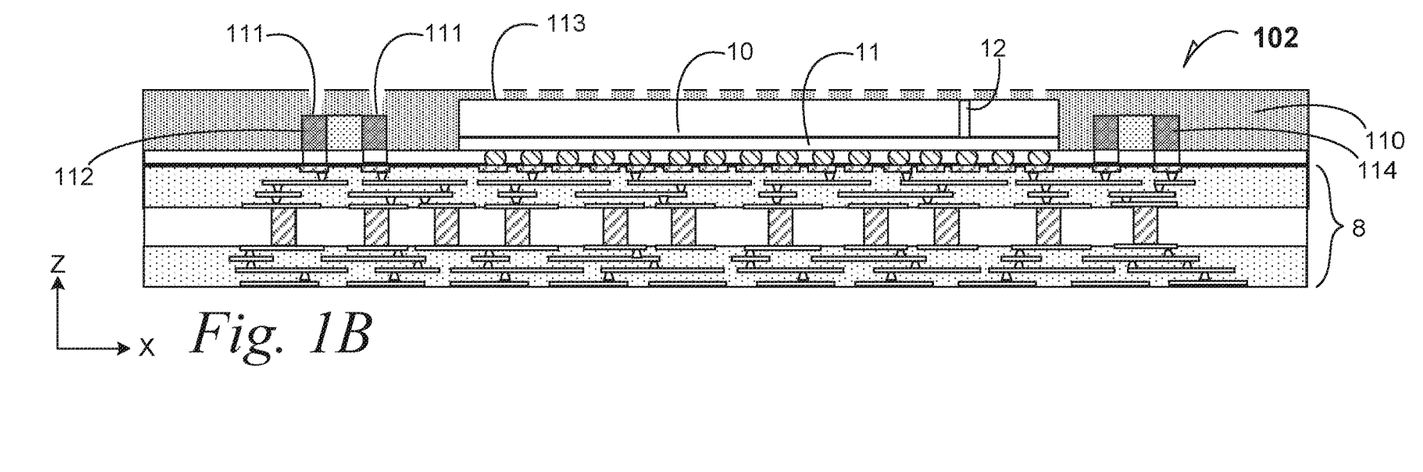
FIG. 1B is a cross-section elevation of the semiconductive apparatus depicted in FIG. 1A after further assembly according to an embodiment.

FIG. 1B is a cross-section elevation 102 of the semiconductive apparatus 101 depicted in FIG. 1A after further assembly according to an embodiment. A primary molding layer 110 has been formed over the package substrate 8 to encapsulate the primary die 10 and the capacitors 112 and 114. Patterning of the primary molding layer 110 has resulted in through-mold via (TMV) trenches 111 (two instances enumerated) that expose the electrodes of the first primary-level capacitor 112 (see FIG. 1). Patterning has also opened TSV trenches, one of which is indicated with reference number 113, for connecting the primary die 10 to the secondary die 20. For illustrative purposes only the TSV 12 is depicted, but the several TSV trenches 113 may each open onto a TSV within the primary die 10. The processes of opening TMV trenches 111 and TSV trenches 113 may be referred to as opening contact corridors in a given molding layer.

Figure 1C:
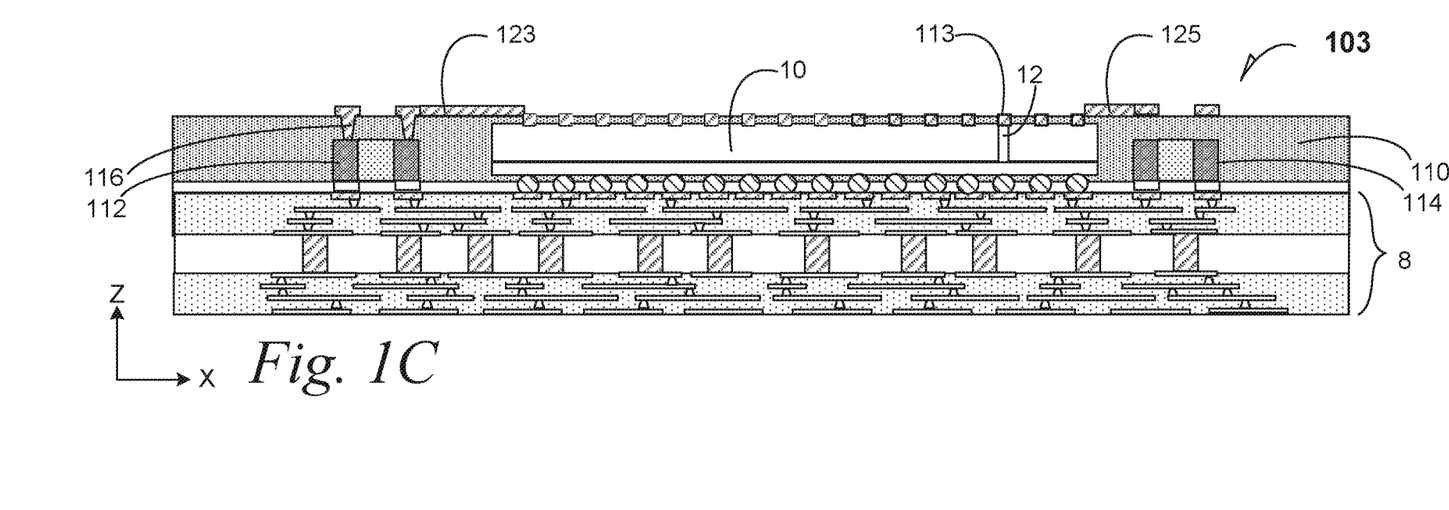
FIG. 1C is a cross-section elevation of the semiconductive apparatus depicted in FIG. 1B after further assembly according to an embodiment.

FIG. 1C is a cross-section elevation 103 of the semiconductive apparatus 102 depicted in FIG. 1B after further assembly according to an embodiment. In an embodiment, a semi-additive plating (SAP) technique has resulted in filled primary-level TMVs 116 the secondary-level merged power rail 123, as well as the several TSV trenches 113 depicted in FIG. 1B are SAP filled. Additionally, the dedicated secondary-level power rail 125 is also formed on the primary molding layer 110.

Figure 1D:
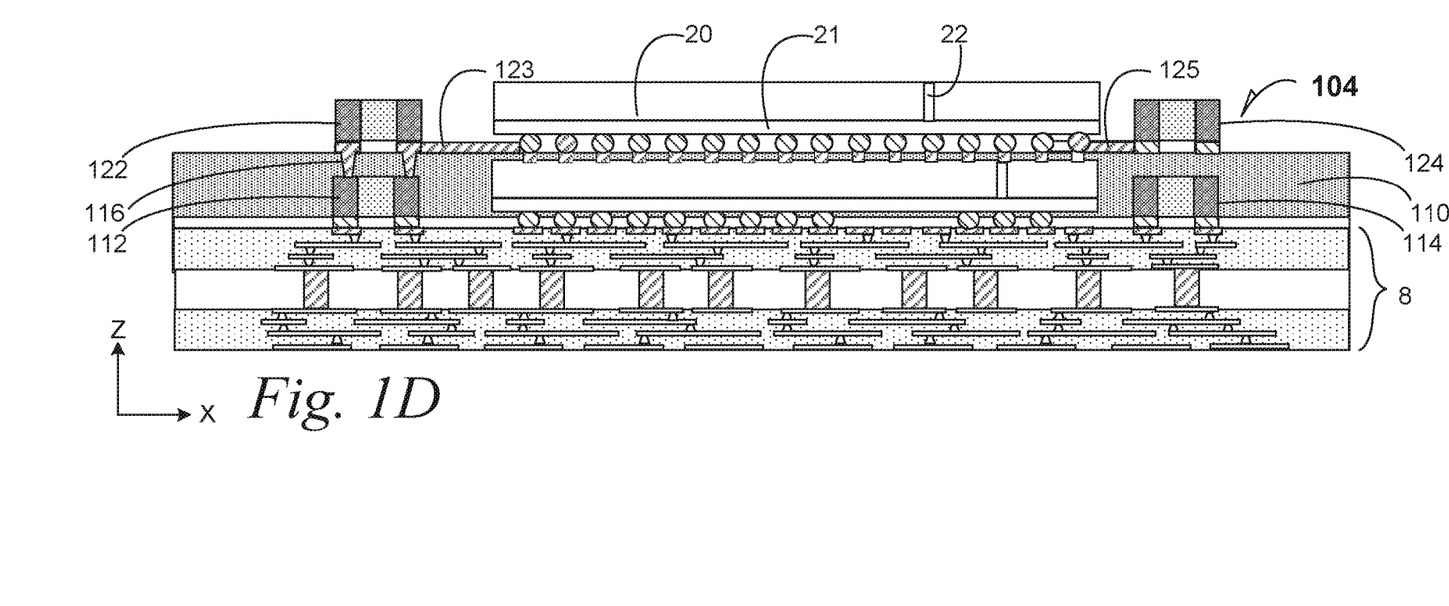
FIG. 1D is a cross-section elevation of the semiconductive apparatus depicted in FIG. 1C after further assembly according to an embodiment.

FIG. 1D is a cross-section elevation 104 of the semiconductive apparatus 103 depicted in FIG. 1C after further assembly according to an embodiment. The secondary device 20 has been seated above (positive Z-direction) the primary device 10. Additionally, the first secondary-level capacitor 122 and the subsequent secondary-level capacitor 124 have been seated on the primary molding layer 110 and are bonded to the SAP-formed power rails and other electrical contact structures.

In an assembly embodiment, the processes depicted in FIGS. 1B, 1C and 1D are repeated for the assembly depicted in FIG. 1D. Thus, the secondary molding layer 120 (see FIG. 1) is formed and patterned over the primary molding layer 110 (see FIG. 1B), the secondary die 20. Next, an SAP is used to form the power rails 133 and 135 (see FIG. 1) similarly to the power rails 123 and 125 (see FIG. 1C). And the tertiary die 30 and the tertiary capacitors 132 and 134 (see FIG. 1) are seated on the secondary molding layer 120. The assembly methods are repeated for the quaternary molding layer 140 and the quaternary die 40 and quaternary capacitors 142 and 144.

Figure 3:
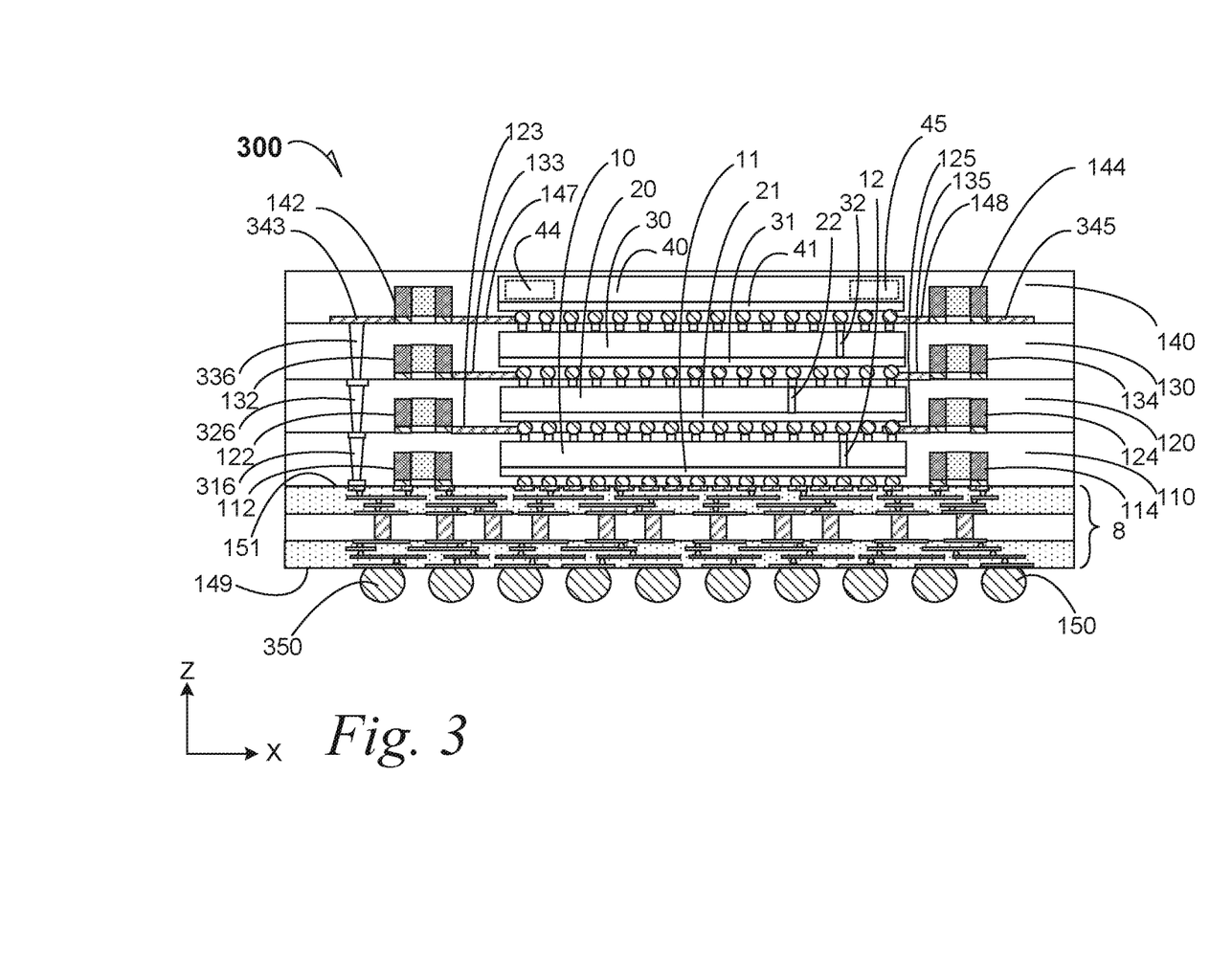
FIG. 3 is a cross-section elevation of a semiconductive apparatus according to an embodiment.

FIG. 3 is a cross-section elevation of a semiconductive apparatus 300 according to an embodiment. A primary die 10 is disposed on a package substrate 8. In an embodiment, a series of TMVs 316, 326 and 336 are described.

The primary die 10 includes an active surface 11 that includes both semiconductive devices and metallization according to an embodiment. The primary die 10 also includes a primary-level through-silicon via (TSV) 12 that communicates from the active surface 11 to the primary die backside. In an embodiment, the primary die 10 is located at a primary package level that is delineated by the presence of a primary molding layer 110.

In an embodiment, a first primary-level capacitor 112 is disposed on the package substrate 8 at the primary package level on a die side 151. The first primary-level capacitor 112 is electrically coupled to the primary die 10 through traces and vias that are located within the package substrate 8. In an embodiment, a subsequent primary-level capacitor 114 is also disposed on the package substrate 8 at the primary package level. The package substrate 8 is electrically bumped on a land side 149 with a plurality of electrical bumps, one of which is indicated with reference number 150.

The subsequent primary-level capacitor 114 is also electrically coupled to the primary die 10 by traces and vias located within the package substrate 8.

In an embodiment, a secondary die 20 is disposed at a secondary level that is delineated within a secondary molding layer 120. The secondary die 20 includes an active surface 21 that includes both semiconductive devices and metallization according to an embodiment. The secondary die 20 also includes a TSV 22 that communicates from the active surface 21 to the secondary die backside.

In an embodiment, a first secondary-level capacitor 122 is disposed within the secondary package level. The first secondary-level capacitor 122 is electrically coupled to the secondary die 20 through a secondary-level dedicated power rail 123 according to an embodiment. In an embodiment, a primary-level through-mold via (TMV) 316 penetrates the primary molding layer 110 and connects vertically (Z-direction) with electrical structures. The primary-level TMV 316 is within the primary level that is delineated by the primary molding layer 110.

In an embodiment, a subsequent secondary-level capacitor 124 is also disposed within the secondary level. The subsequent secondary-level capacitor 124 is also electrically coupled to the secondary die 20 by a dedicated secondary-level power rail 125, Communication between the primary die 10 and the secondary die 20 is also accomplished by a the primary-level TSV 12.

Where the secondary die 20 is located within the last layer of a semiconductive package, the secondary die 20 and the secondary level delineated by the secondary molding layer 120 and other structures, are referred to as the subsequent die 20, subsequent molding layer 120, etc.

In an embodiment, a secondary-level TMV 326 penetrates the secondary molding layer 120 and connects vertically below (Z-direction) with the primary-level TMV 316 and electrical structures above.

In an embodiment, a tertiary die 30 is disposed at a tertiary level that is delineated within a tertiary molding layer 130. The tertiary die 30 includes an active surface 31 that includes both semiconductive devices and metallization according to an embodiment. The tertiary die 30 also includes a TSV 32 that communicates from the active surface 31 to the tertiary die backside.

In an embodiment, a first tertiary-level capacitor 132 is disposed within the tertiary package level. The first tertiary-level capacitor 132 is electrically coupled to the tertiary die 30 through a tertiary-level dedicated power rail 133 according to an embodiment.

In an embodiment, a tertiary-level TMV 336 penetrates the tertiary molding layer 130 and connects vertically below with the secondary-level TMV 326 and the primary-level TMV 316 and with electrical structures above.

In an embodiment, a subsequent tertiary-level capacitor 134 is also disposed within the tertiary level. The subsequent tertiary-level capacitor 134 is also electrically coupled to the tertiary die 30 by a tertiary-level dedicated power rail 135. Communication between the second die 20 and the tertiary die 30 is also accomplished by a secondary-level TSV 22.

Where the tertiary die 30 is located within the last layer of a semiconductive package, the tertiary die 30 and the tertiary level delineated by the tertiary molding layer 130 and other structures, are referred to as the subsequent die 30, subsequent molding layer 130, etc.

In an embodiment, a quaternary die 40 is disposed at a quaternary level that is delineated within a quaternary molding layer 140. The quaternary die 40 includes an active surface 41 that includes both semiconductive devices and metallization according to an embodiment. Where the quaternary die 40 is the last die in a die stack, no TSV may be present within the quaternary die 40.

In an embodiment, a first quaternary-level capacitor 142 is disposed within the quaternary package level. The first quaternary-level capacitor 142 is electrically coupled to the quaternary die 40 through a merged power rail 343 and a quaternary-level conductive trace 147 associated with an opposite polarity of the power rail (e.g., Vss or ground) according to an embodiment.

The tertiary-level TMV 336 is electrically coupled to the secondary-level TMV 326 and the primary-level TMV 316. Additionally, the tertiary-level TMV 336 contacts the quaternary-level merged power rail 343 such that a dedicated power bump 350 on the land side of the package substrate 8 is used to deliver a useful decoupling charge to the quaternary die 40 through the first quaternary-level capacitor 142 through the chain of the primary-level TMV 316, the secondary-level TMV 326, the tertiary-level TMV 336 and the quaternary-level Vss conductive trace 147.

In an embodiment, a subsequent quaternary-level capacitor 144 is also disposed within the quaternary level. The subsequent quaternary-level capacitor 144 is also electrically coupled to the quaternary die 40 by a quaternary-level dedicated power rail 345 and a quaternary-level conductive trace 148 associated with an opposite polarity of the power rail (e.g., Vss or ground). Communication between the tertiary die 30 and the quaternary die 40 is also accomplished by a tertiary-level TSV 32.

Where the quaternary die 40 is located within the last layer of a semiconductive package, the quaternary die 40 and the quaternary level delineated by the quaternary molding layer 140 and other structures, are referred to as the subsequent die 40, subsequent molding layer 140, etc.

Figure 4:
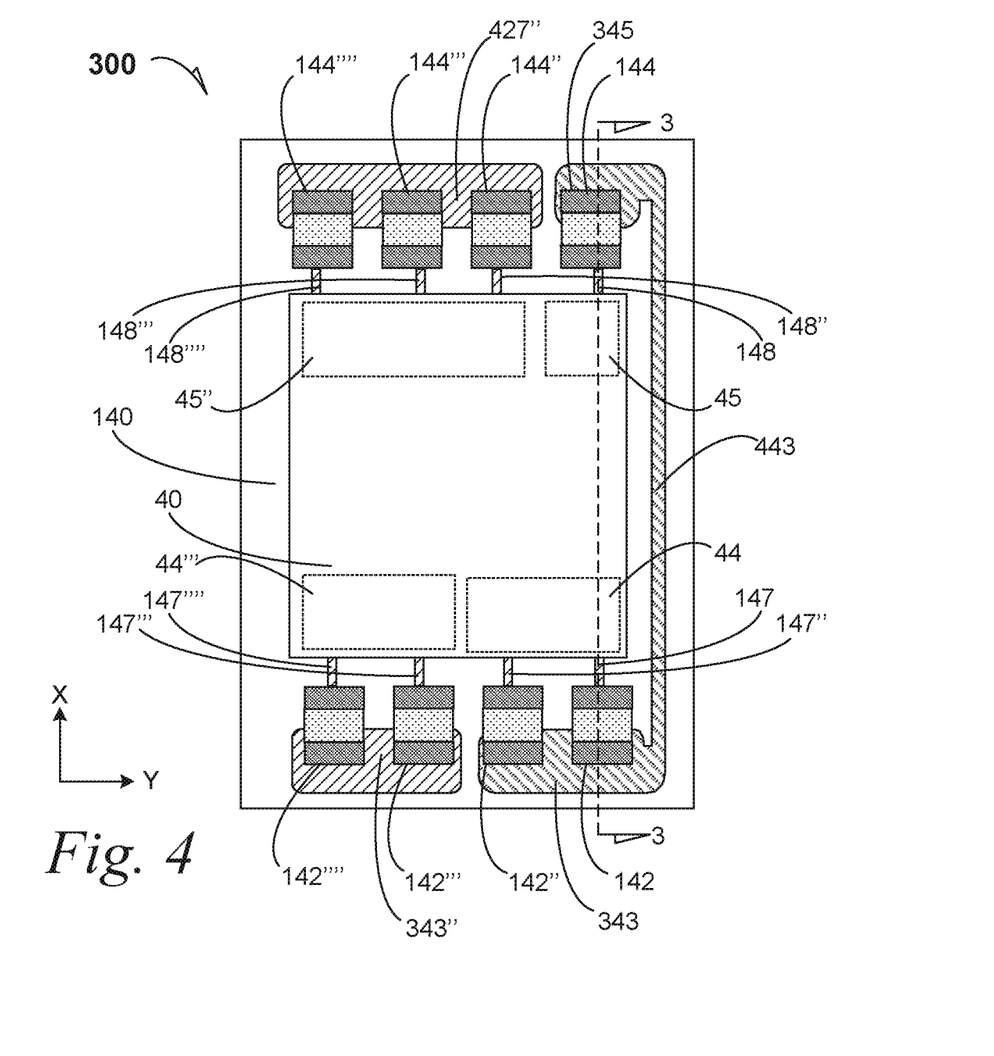
FIG. 4 is a top plan cut away view of the semiconductive apparatus depicted in FIG. 3 according to an embodiment.

FIG. 4 is a top plan cut away view of the semiconductive apparatus 300 depicted in FIG. 3 according to an embodiment. The top plan cut-away view is taken within the quaternary level. The quaternary die 40 is exposed within the quaternary molding layer 140. The cross-section view depicted in FIG. 3 is taken from FIG. 4 along the section line 3-3.

The first quaternary-level capacitor 142 is exposed along with the quaternary-level merged power rail 343. The quaternary-level merged power rail 343 touches the first quaternary-level capacitor 142 at an electrode portion of the capacitor 142 as well as another quaternary-level capacitor 142". Additionally, Vss or ground conductive traces 147 and 147" complete electrical flow through the quaternary-level capacitors 142 and 142" such that a first feature 44 of the quaternary die 40 is able to receive a useful capacitor discharge from the quaternary-level capacitors 142 and 142". In an embodiment, only one of the quaternary-level capacitors 142 and 142" is needed to deliver a useful capacitor discharge. In this embodiment, semiconductive gate keeping within or near the first feature 44 allows only a single-capacitor discharge.

In an embodiment, a discharge is simultaneously enabled between at least one of the capacitors 142 and 142" and the capacitor 144. A long-rail portion 443 of the power rail connects all three capacitors 142 and 142" and 144, and the dedicated power bump 350 (see FIG. 3) allows a discharge potential to be delivered to any or all of these capacitors 142 and 142" and 144 through the several TMVs 316, 326 and 336.

In an embodiment, the quaternary-level capacitors 142'" and 142"" are coupled to a quaternary-level merged power rail 343" for dual-capacitor simultaneous discharge capabilities. In this embodiment, the quaternary-level capacitors 142'" and 142"" deliver a useful discharge to a feature 44"" within the quaternary-level die 40.

The subsequent quaternary-level capacitor 144 is coupled to the quaternary-level capacitors 142 and 142" by the merged power rails 343, 345 and the long-rail portion 443. The merged power rails 343, 345 are coupled through the long-rail portion 443 according to an embodiment.

Reference is made to FIG. 3 with FIG. 4. In an embodiment, the quaternary die 40 uses the several TMVs 316, 326 and 336 to deliver a discharge potential to any or all of the capacitors 142 and 142" and 144 for discharge into the quaternary die 40 at the first die feature 44 and the subsequent die feature 45. The capacitor configurations are located as close as useful to the several die features according to discharge requirements in the die features.

As illustrated in FIG. 4, several capacitors are present beyond the first quaternary-level capacitor 142 and the subsequent quaternary-level capacitor 144. In an embodiment, the first quaternary-level capacitor 142 is accompanied by three quaternary-level capacitors 142", 142'" and 142"". The first die feature 44 is located within the quaternary die 40 as seen in FIG. 3. The first die feature 44 uses the capacitors 142 and 142" for discharge requirements according to an embodiment, and in an embodiment where more capacitor discharge is needed for the first die feature 44, the merged rail 443 allows for discharge of a discharge potential that may originate at the dedicated power bump 350 seen in FIG. 3.

As illustrated in FIG. 4, several capacitors are present beyond the subsequent quaternary-level capacitor 144. In an embodiment, the subsequent quaternary-level capacitor 144 is accompanied by three subsequent quaternary-level capacitors 144", 144'" and 144"". A subsequent die feature 45" is located within the quaternary die 40.

Figure 5:
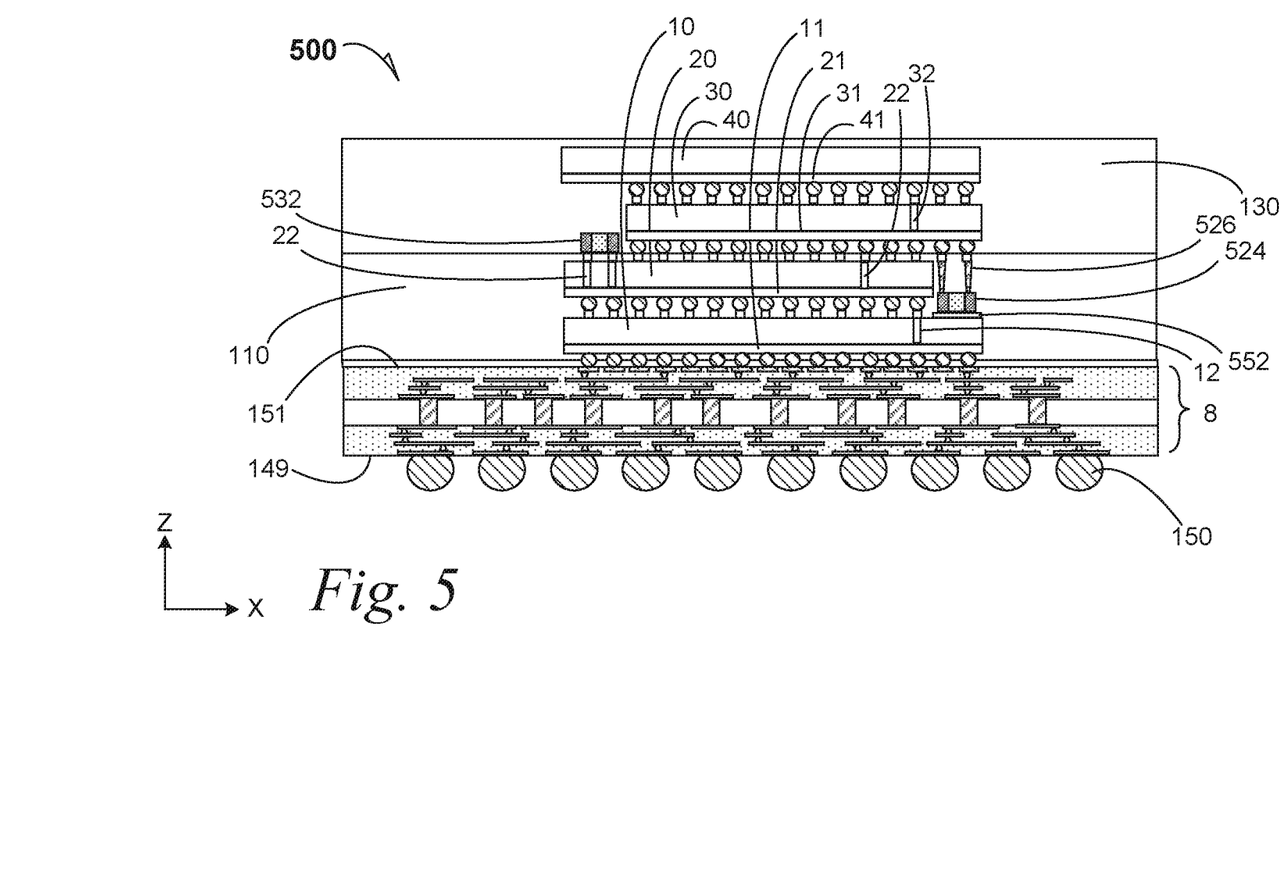
FIG. 5 is a cross-section elevation of a semiconductive apparatus according to an embodiment.

FIG. 5 is a cross-section elevation of a semiconductive apparatus 500 according to an embodiment. This embodiment includes die-shadow capacitor configurations. A capacitor that is seated under (Z-direction) an overhanging portion of a die is termed "die-shadow." Additionally, a capacitor that is mounted on a die is termed "die-shadowing"

A primary die 10 is disposed on a package substrate 8 at a die side 151. The package substrate 8 is electrically bumped on a land side 149 with a plurality of electrical bumps, one of which is indicated with reference number 150.

The primary die 10 includes an active surface 11 that includes both semiconductive devices and metallization according to an embodiment. The primary die 10 also includes a primary-level through-silicon via (TSV) 12 that communicates from the active surface 11 to the primary die backside. In an embodiment, the primary die 10 is located on the package substrate 8 within a primary package level that is delineated by the presence of a first molding layer 110.

In an embodiment, a secondary die 20 is disposed within the first molding layer 110 and upon the primary die 10. The secondary die 20 includes an active surface 21 that includes both semiconductive devices and metallization according to an embodiment. In an embodiment, the secondary die 20 also includes a TSV 22 that communicates from the active surface 21 to the secondary die backside.

In an embodiment, a first secondary-level capacitor 524 is disposed upon a dielectric adhesive 552 and on the back surface of the primary die 10. The first secondary-level capacitor 524 is a die-shadowing capacitor as it is seated on the primary die 10 such that it would cast a shadow onto the X-Y footprint of the primary die 10. The first secondary-level capacitor 524 is also a die-shadow capacitor as it is shadowed by the die 30, which in this embodiment is a tertiary-level die 30.

Electrical communication to the first secondary-level capacitor 524 is accomplished using a secondary-level through-mold via 526 that receives decoupling-charge potential from the tertiary die 30. Consequently because of the electrical TMV connections 526, the first secondary-level capacitor delivers decoupling-charge potential to the tertiary die 30. Additionally, the first secondary-level capacitor 524 is ensconced within the X-Y footprint of the tertiary die 30. In other words, the first secondary-level capacitor 524 is located as a die-shadow capacitor at the secondary level and within the die shadow (X-Y footprint) of the tertiary die 30.

In an embodiment, the tertiary die 30 is disposed on the secondary die 20 and at a tertiary level that is delineated within a tertiary molding layer 130. The tertiary die 30 includes an active surface 31 that includes both semiconductive devices and metallization according to an embodiment. The tertiary die 30 also includes a TS V 32 that communicates from the active surface 31 to the tertiary die backside. The first secondary-level capacitor 524 provides a decoupling discharge to the tertiary die through the TMVs 526.

In an embodiment, a first tertiary-level capacitor 532 is disposed within the tertiary package level and it is electrically coupled through TSVs 22 to the secondary die 20. The first tertiary-level capacitor 532 is die-shadow mounted because a quaternary die 40 overhangs from the tertiary die 30. The first tertiary-level capacitor 532 is electrically coupled to the secondary die 20 through the TSVs 22 according to an embodiment.

The quaternary die 40 is mounted on the tertiary die 30 and is electrically coupled to the tertiary die 30 though the TSV 32 in the tertiary die 30. The tertiary die and the quaternary die are within the delineation of the tertiary molding layer 130.

Figure 6:
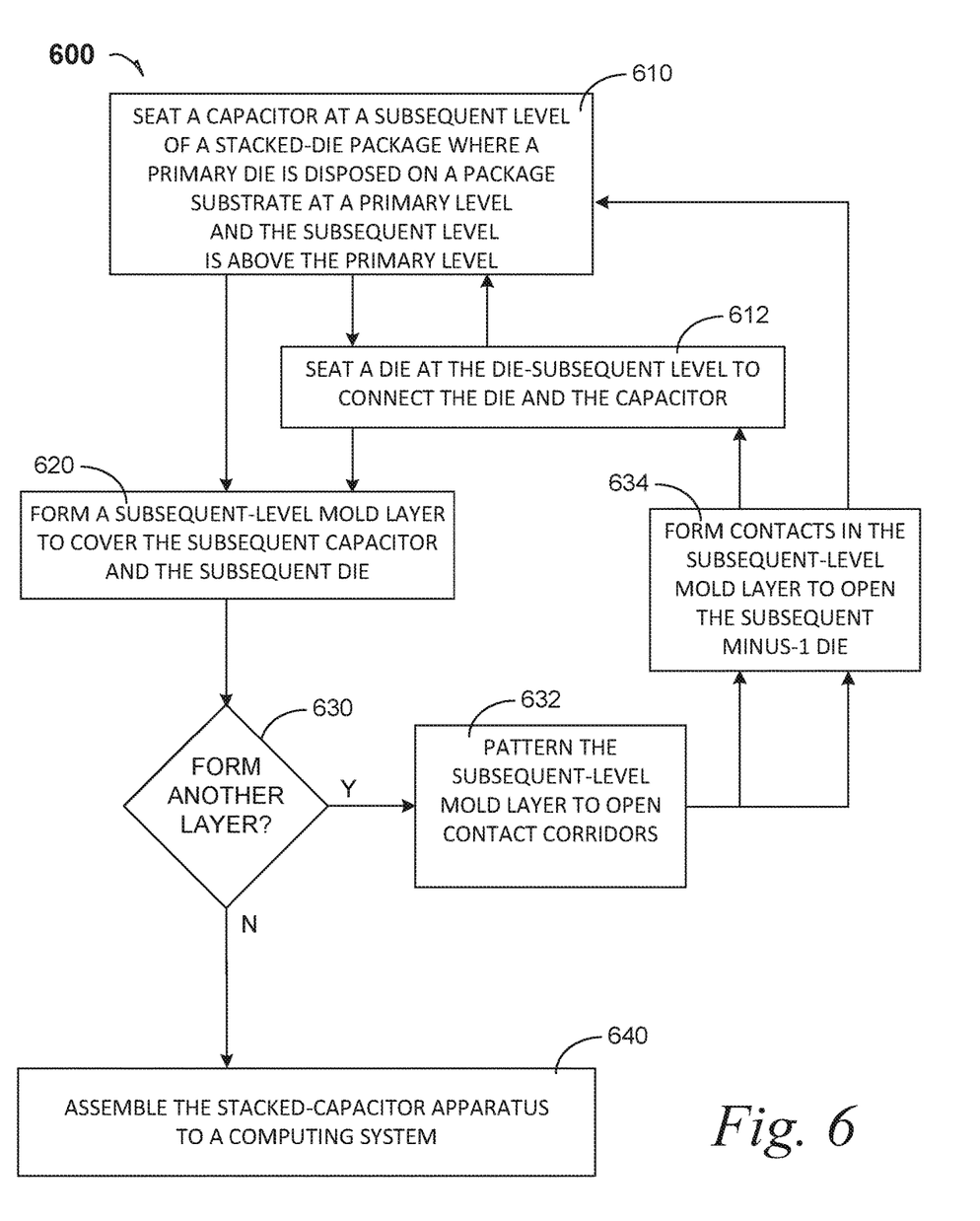
FIG. 6 is an assembly flow diagram according to several embodiments.

FIG. 6 is an assembly flow diagram 600 according to an embodiment.

At 610, the assembly flow includes seating a capacitor at a subsequent level in an SDSC-architecture package, where a primary die is disposed on a package substrate at a primary level, and the subsequent level is above the primary level. In a non-limiting example embodiment, the first secondary-level capacitor 122 is seated within the secondary level delineated by the secondary molding layer 120, and the capacitor 122 is therefore seated at a package level that is subsequent to the primary level where the primary die 10 is seated.

At 612, the assembly flow includes seating a die at the subsequent level to connect the capacitor to the die. In a non-limiting example embodiment, the secondary die 20 is seated at the secondary level, delineated by the secondary molding layer 120, and the first secondary-level capacitor 122 is connected to the secondary die 20. Where the secondary level is the final level in a SDSC-architecture package, the secondary die 20 is the subsequent die 20 and the first secondary-level capacitor 122 is the first subsequent-level capacitor 122.

At 620, the assembly flow includes forming a subsequent-level molding layer of the capacitor. In a non-limiting example embodiment, the secondary molding layer 120 is formed over the first secondary-level capacitor 122. Where the secondary-level molding layer 120 is the final level in the SDSC-architecture package, the secondary-level molding layer 120 is the subsequent-level molding layer 120.

At 630, the assembly flow includes a decision to form another layer in an incremental procedure for the SDSC-architecture package. Where the decision is in the affirmative, the assembly flow can be directed to either 610, 612, or both. Where the decision is in the affirmative, the assembly flow branches to 632, where the subsequent-level molding layer is patterned to open contact corridors. In a non-limiting example embodiment, the secondary molding layer 120 is patterned to form TMV and TSV contact corridors. See FIG. 1B.

At 634, the assembly flow includes patterning contacts in the contact corridors. In a non-limiting example embodiment, any one of merged TMVs 116, merged power rails 123, dedicated power rails 125 and filled TSVs trenches 113 are formed by SAP processing. See FIG. 1C.

The assembly flow then returns to at least one of 610 and 612 to seat at least one of a subsequent die and a subsequent-level capacitor on the previous level. In a non-limiting example embodiment, at least one of the first secondary-level capacitor 122 (at 610) and a secondary-level die 20 are seated on the N−$1^{st}$ level (the primary level delineated by the primary mold material 110).

The assembly flow then returns to 620 to form a protective molding layer on the Nth level of the SDSC-architecture package.

At 640, the assembly flow includes assembling the SDSC-architecture package to a computing system.

Figure 7:
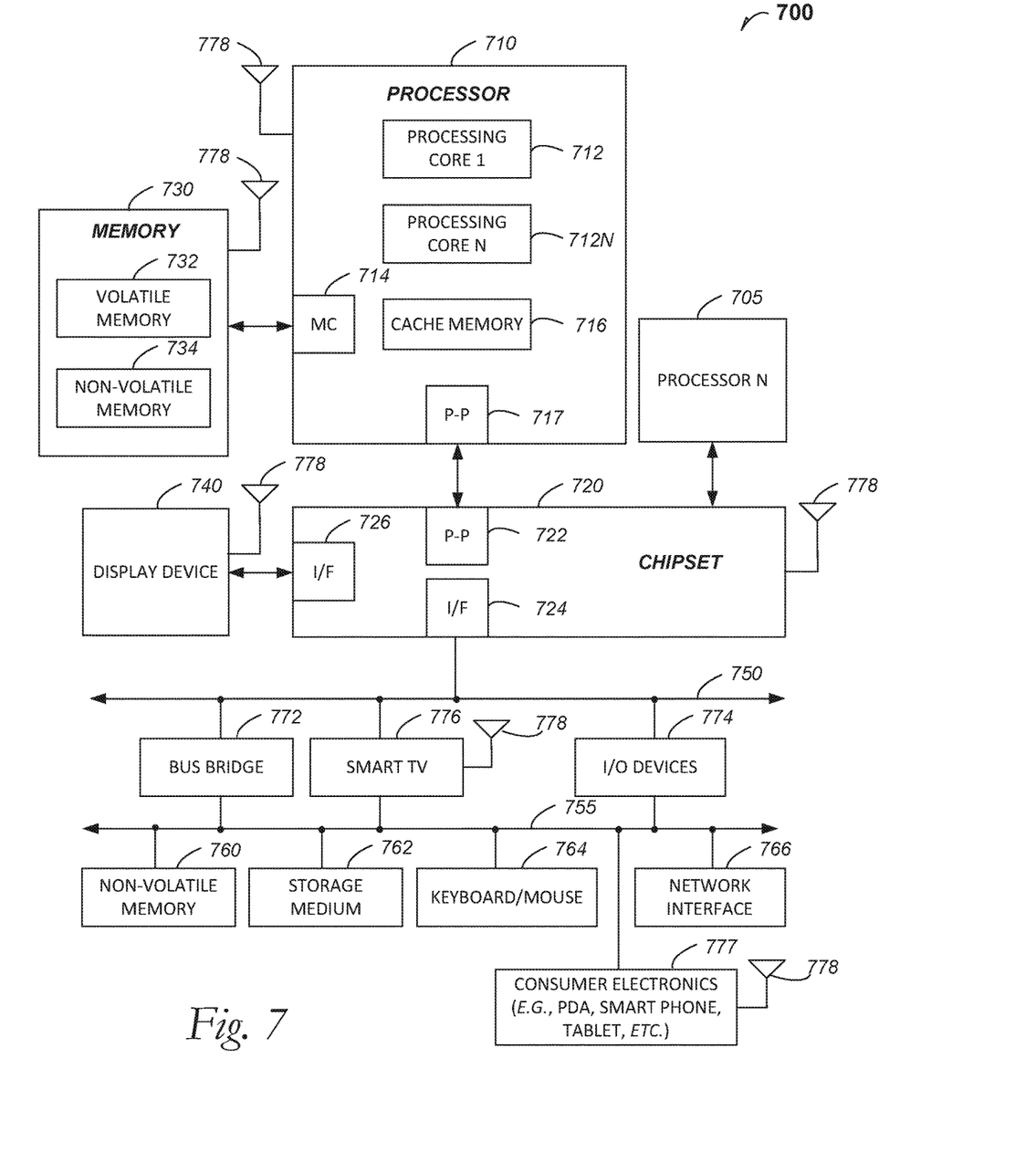
FIG. 7 is included to show an example of a higher level device application for the disclosed embodiments.

FIG. 7 is included to show an example of a higher-level device application for the disclosed embodiments. The SDSC-architecture package embodiments are part of an apparatus that may be found in several parts of a computing system. In an embodiment, a computing system 700 includes, but is not limited to, a desktop computer. In an embodiment, a system 700 includes, but is not limited to a laptop computer. In an embodiment, a system 700 includes, but is not limited to a netbook. In an embodiment, a system 700 includes, but is not limited to a tablet. In an embodiment, a system 700 includes, but is not limited to a notebook computer. In an embodiment, a system 700 includes, but is not limited to a personal digital assistant (PDA). In an embodiment, a system 700 includes, but is not limited to a server. In an embodiment, a system 700 includes, but is not limited to a workstation. In an embodiment, a system 700 includes, but is not limited to a cellular telephone. In an embodiment, a system 700 includes, but is not limited to a mobile computing device. In an embodiment, a system 700 includes, but is not limited to a smart phone. In an embodiment, a system 700 includes, but is not limited to an internet appliance. Other types of computing devices may be configured with the microelectronic device that includes SDSC-architecture package embodiments.

In an embodiment, the processor 710 has one or more processing cores 712 and 712N, where 712N represents the Nth processor core inside processor 710 where N is a positive integer. In an embodiment, the electronic device system 700 using a SDSC-architecture package embodiment that includes multiple processors including 710 and 705, where the processor 705 has logic similar or identical to the logic of the processor 710. In an embodiment, the processing core 712 includes, but is not limited to, pre-fetch logic to fetch instructions, decode logic to decode the instructions, execution logic to execute instructions and the like. In an embodiment, the processor 710 has a cache memory 716 to cache at least one of instructions and data for the MAA apparatus in the system 700. The cache memory 716 may be organized into a hierarchal structure including one or more levels of cache memory.

In an embodiment, the processor 710 includes a memory controller 714, which is operable to perform functions that enable the processor 710 to access and communicate with memory 730 that includes at least one of a volatile memory 732 and a non-volatile memory 734. In an embodiment, the processor 710 is coupled with memory 730 and chipset 720. The processor 710 may also be coupled to a wireless antenna 778 to communicate with any device configured to at least one of transmit and receive wireless signals. In an embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 734 includes, but is not limited to, flash memory, phase change memory (PCM), read-only memory (ROM), electrically erasable programmable read-only memory (EEPROM), or any other type of non-volatile memory device.

The memory 730 stores information and instructions to be executed by the processor 710. In an embodiment, the memory 730 may also store temporary variables or other intermediate information while the processor 710 is executing instructions. In the illustrated embodiment, the chipset 720 connects with processor 710 via Point-to-Point (PtP or P-P) interfaces 717 and 722. Either of these PtP embodiments may be achieved using a SDSC-architecture package embodiment as set forth in this disclosure. The chipset 720 enables the processor 710 to connect to other elements in the SDSC-architecture package embodiments in a system 700. In an embodiment, interfaces 717 and 722 operate in accordance with a PtP communication protocol such as the Intel® QuickPath interconnect (QPI) or the like. In other embodiments, a different interconnect may be used.

In an embodiment, the chipset 720 is operable to communicate with the processor 710, 705N, the display device 740, and other devices 772, 776, 774, 760, 762, 764, 766, 777, etc. The chipset 720 may also be coupled to a wireless antenna 778 to communicate with any device configured to at least do one of transmit and receive wireless signals.

The chipset 720 connects to the display device 740 via the interface 726. The display 740 may be, for example, a liquid crystal display (LCD), a plasma display, cathode ray tube (CRT) display, or any other form of visual display device. In and embodiment, the processor 710 and the chipset 720 are merged into a SDSC-architecture package in a system. Additionally, the chipset 720 connects to one or more buses 750 and 755 that interconnect various elements 774, 760, 762, 764, and 766. Buses 750 and 755 may be interconnected together via a bus bridge 772 such as at least one SDSC-architecture package embodiment. In one embodiment, the chipset 720, via interface 724, couples with a non-volatile memory 760, a mass storage device(s) 762, a keyboard/mouse 764, a network interface 766, smart TV 776, and the consumer electronics 777, etc.

In an embodiment, the mass storage device 762 includes, but is not limited to, a solid state drive, a hard disk drive, a universal serial bus flash memory drive, or any other form of computer data storage medium. In one embodiment, the network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra. Wide Band (UWB), Bluetooth, WiMax, or any form of wireless communication protocol.

While the modules shown in FIG. 7 are depicted as separate blocks within the SDSC-architecture package embodiment in a computing system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into the processor core 712.

Where useful, the computing system 700 may have a broadcasting structure interface such as for affixing the SDSC-architecture package to a cellular tower.

To illustrate the SDSC-architecture package embodiments and methods disclosed herein, a non-limiting list of examples is provided herein:

Example 1 is a semiconductive apparatus, comprising: a primary die disposed on a package substrate at a primary package level; a subsequent die stacked above the primary die at a subsequent package level; and a first subsequent-level capacitor located at the subsequent package level, wherein the first subsequent-level capacitor is electrically coupled to the subsequent die.

In Example 2, the subject matter of Example 1 optionally includes a first primary-level capacitor disposed on the package substrate at the primary package level, wherein the first primary-level capacitor is electrically coupled to the primary die.

In Example 3, the subject matter of Example 2 optionally includes a subsequent primary-level capacitor disposed on the package substrate at the primary package level, wherein the subsequent primary-level capacitor is electrically coupled to the primary die.

In Example 4, the subject matter of any one or more of Examples 2-3 optionally include a subsequent primary-level capacitor disposed on the package substrate at the primary package level, wherein the subsequent primary-level capacitor is electrically coupled to the primary die; and a subsequent subsequent-level capacitor located at the subsequent package level, wherein the subsequent subsequent-level capacitor is electrically coupled to the subsequent die.

In Example 5, the subject matter of any one or more of Examples 2-4 optionally include a secondary die located at a secondary package level that is stacked above and on the primary package level, and that is located below the subsequent package level; a first secondary-level capacitor located at the secondary package level, wherein the first secondary-level capacitor is electrically coupled to the secondary die; a subsequent primary-level capacitor disposed on the package substrate at the primary package level, wherein the subsequent primary-level capacitor is electrically coupled to the primary die; and a subsequent secondary-level capacitor located at the secondary package level, wherein the subsequent secondary-level capacitor is electrically coupled to the secondary die.

In Example 6, the subject matter of Example 5 optionally includes wherein the first primary-level capacitor, and the first subsequent-level capacitor share a merged power rail, wherein the subsequent primary-level capacitor is electrically coupled to the primary die by a dedicated power rail, and wherein the subsequent secondary-level capacitor is electrically coupled to the secondary die by a dedicated power rail.

In Example 7, the subject matter of any one or more of Examples 1-6 optionally include wherein the first primary-level capacitor and the first subsequent-level capacitor share a merged power rail.

In Example 8, the subject matter of any one or more of Examples 1-7 optionally include wherein the first primary-level capacitor and the first subsequent-level capacitor share a merged power rail, wherein the subsequent primary-level capacitor is electrically coupled to the primary die by a dedicated power rail, further including a subsequent subsequent-level capacitor located as the secondary package level, and wherein the subsequent subsequent-level capacitor is electrically coupled to the subsequent die by a dedicated power rail.

In Example 9, the subject matter of any one or more of Examples 1-8 optionally include a secondary die located at a secondary package level that is stacked above and on the primary package level, and that is located below the subsequent package level; a first secondary-level capacitor located at the secondary package level, wherein the first secondary-level capacitor is electrically coupled to the secondary die; a subsequent primary-level capacitor disposed on the package substrate at the primary package level, wherein the subsequent primary-level capacitor is electrically coupled to the primary die; a subsequent secondary-level capacitor located at the secondary package level, wherein the subsequent secondary-level capacitor is electrically coupled to the secondary die; a tertiary die located at a tertiary package level that is stacked above and on the secondary package level, and that is located below the subsequent package level; a first tertiary-level capacitor located at the tertiary package level, wherein the first tertiary-level capacitor is electrically coupled to the tertiary die; and a subsequent tertiary-level capacitor located at the tertiary package level, wherein the subsequent tertiary-level capacitor is electrically coupled to the tertiary die.

In Example 10, the subject matter of any one or more of Examples 1-9 optionally include a secondary die located at a secondary package level that is stacked above and on the primary package level, and that is located below the subsequent package level; a first secondary-level capacitor located at the secondary package level, wherein the first secondary-level capacitor is electrically coupled to the secondary die; a subsequent primary-level capacitor disposed on the package substrate at the primary package level, wherein the subsequent primary-level capacitor is electrically coupled to the primary die; a subsequent secondary-level capacitor located at the secondary package level, wherein the subsequent secondary-level capacitor is electrically coupled to the secondary die; a tertiary die located at a tertiary package level that is stacked above and on the secondary package level, and that is located below the subsequent package level; a first tertiary-level capacitor located at the tertiary package level, wherein the first tertiary-level capacitor is electrically coupled to the tertiary die; a subsequent tertiary-level capacitor located at the tertiary package level, wherein the subsequent tertiary-level capacitor is electrically coupled to the tertiary die; and wherein the subsequent level is a quaternary level that is disposed above and on the tertiary level, wherein the first subsequent-level capacitor is a first quaternary-level capacitor, and further including a subsequent quaternary-level capacitor disposed above and on the tertiary level, and wherein the first quaternary-level capacitor is electrically coupled to the quaternary-level die.

In Example 11, the subject matter of any one or more of Examples 1-10 optionally include a secondary die disposed above and on the primary package level; wherein the subsequent die is a tertiary die disposed above and on the secondary die, wherein first subsequent-level capacitor is located at the secondary package level and is a first secondary-level capacitor that is electrically coupled to the tertiary die by a through-mold via, and wherein the tertiary die shadows the first secondary-level capacitor.

In Example 12, the subject matter of Example 11 optionally includes a tertiary-level capacitor that is seated on the secondary die, wherein the tertiary-level capacitor is electrically coupled to the secondary die by a through-silicon via.

In Example 13, the subject matter of Example 12 optionally includes a quaternary die seated above and on the tertiary die, and wherein the tertiary-level capacitor is shadowed by the quaternary die.

Example 14 is an assembly process comprising: seating a capacitor at a subsequent level of a stacked-die package, wherein a primary die is located at a primary package level that is disposed on a package substrate, and wherein the subsequent level is above the primary level; connecting the capacitor to at least one of the primary die and a subsequent die; and forming a molding layer that at least partially encapsulates the capacitor and the subsequent die.

Example 15 is an assembly process of Example 14, wherein the capacitor is a first tertiary-level capacitor, and wherein the subsequent die is a tertiary die located above and on a secondary package level, further including: seating a secondary die above and on the primary die at the secondary package level; seating a first secondary-level capacitor above and on the primary package level, and coupling the first secondary-level capacitor to the secondary die by a merged power rail; seating a subsequent secondary-level capacitor above an on the primary package level, and coupling the subsequent secondary-level capacitor to the secondary die by a dedicated power rail.

Example 16 is an assembly process of Example 14, wherein the capacitor is a first quaternary-level capacitor, and wherein the subsequent die is a quaternary die located above and on a tertiary package level, further including: seating a secondary die above and on the primary die at a secondary package level; seating a first secondary-level capacitor above and on the primary package level, and coupling the first secondary-level capacitor to the secondary die by a merged power rail; seating a tertiary die above an on the secondary package level; seating a first tertiary-level capacitor above and on the secondary package level, and coupling the first tertiary-level capacitor to the tertiary die by a merged power rail; seating a subsequent tertiary-level capacitor above an on the secondary package level, and coupling the subsequent tertiary-level capacitor to the tertiary die by a dedicated power rail.

In Example 17, the subject matter of any one or more of Examples 14-16 optionally include wherein the capacitor is seated on the primary die by an adhesive, further including: seating a tertiary die above the capacitor, wherein the tertiary die shadows the capacitor.

Example 18 is a computing system, comprising: a primary die disposed on a package substrate at a primary package level; a subsequent die stacked above the primary die at a subsequent package level; a first subsequent-level capacitor located at the subsequent package level, wherein the first subsequent-level capacitor is electrically coupled to the subsequent die; and a board bonded to the package substrate at an electrical bump array; and a shell portion of the board, wherein the shell portion electrically insulates the primary die and the board.

In Example 19, the subject matter of Example 18 optionally includes a first primary-level capacitor disposed on the package substrate at the primary package level, wherein the first primary-level capacitor is electrically coupled to the primary die; a subsequent primary-level capacitor disposed on the package substrate at the primary package level, wherein the subsequent primary-level capacitor is electrically coupled to the primary die.

In Example 20, the subject matter of Example 19 optionally includes a subsequent subsequent-level capacitor located at the subsequent package level, wherein the subsequent subsequent-level capacitor is electrically coupled to the subsequent die. The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." in this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductive apparatus, comprising:
   a plurality of stacked dies on a package substrate;
   a plurality of stacked capacitors associated with at least some of the dies in the plurality of stacked dies;
   one or more through mold vias (TMVs) that communicate power between the plurality of stacked capacitors;
   wherein the plurality of stacked capacitors are located on a periphery of the plurality of stacked dies.

2. The semiconductive apparatus of claim 1, wherein there is at least one capacitor corresponding to each die in the plurality of stacked dies.

3. The semiconductive apparatus of claim 1, wherein there are eight capacitors corresponding to each die in the plurality of stacked dies.

4. The semiconductive apparatus of claim 1, wherein there are four capacitors on opposing sides of a die in the plurality of stacked dies.

5. The semiconductive apparatus of claim 1, wherein stacked capacitors on two adjacent levels in the plurality of stacked capacitors share a common merged power rail.

6. The semiconductive apparatus of claim 1, wherein the plurality of stacked dies and the plurality of stacked capacitors are encapsulated in one or more layers of a molding material.

7. The semiconductive apparatus of claim 1, further including one or more through silicon vias (TSVs) that communicate power between levels to both the plurality of stacked dies and the plurality of stacked capacitors.

* * * * *